(12) United States Patent
Gadonniex et al.

(10) Patent No.: US 11,138,853 B2
(45) Date of Patent: Oct. 5, 2021

(54) INTRUSION ENTRY PROTECTION

(71) Applicant: Carrier Corporation, Palm Beach Gardens, FL (US)

(72) Inventors: Dennis Michael Gadonniex, Bradenton, FL (US); Rick L. Mantz, Colorado Springs, CO (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 16/860,215

(22) Filed: Apr. 28, 2020

(65) Prior Publication Data

US 2020/0365001 A1 Nov. 19, 2020

Related U.S. Application Data

(60) Provisional application No. 62/849,423, filed on May 17, 2019.

(51) Int. Cl.
| | | |
|---|---|---|
| *G08B 17/10* | (2006.01) | |
| *H05K 7/14* | (2006.01) | |
| *G08B 21/14* | (2006.01) | |
| *H05K 5/03* | (2006.01) | |
| *H05K 5/02* | (2006.01) | |

(52) U.S. Cl.
CPC ............. *G08B 17/10* (2013.01); *G08B 21/14* (2013.01); *H05K 5/0213* (2013.01); *H05K 5/03* (2013.01); *H05K 7/1427* (2013.01)

(58) Field of Classification Search
None
See application file for complete search history.

(56) References Cited

U.S. PATENT DOCUMENTS

| | | | |
|---|---|---|---|
| 4,649,376 A * | 3/1987 | Frank ..................... | G08B 7/062 |
| | | | 174/101 |
| 6,288,647 B1 * | 9/2001 | Yamano ............... | G08B 17/107 |
| | | | 250/574 |
| 6,522,254 B1 | 2/2003 | Yamano | |

(Continued)

FOREIGN PATENT DOCUMENTS

| | | |
|---|---|---|
| CN | 206236237 U | 6/2017 |
| CN | 105931416 B | 3/2018 |

(Continued)

OTHER PUBLICATIONS

Safelincs, "How Optical Smoke Alarms Work," URL: https://www.safelincs.co.uk/smoke-alarm-types-optical-alarms-overview/; Retrieved: Apr. 1, 2019; 3 pages.

(Continued)

*Primary Examiner* — Fekadeselassie Girma
(74) *Attorney, Agent, or Firm* — Cantor Colburn LLP

(57) ABSTRACT

Systems for protecting electrical components in a detection device are provided. Aspects include a housing comprising a plurality of vents configured to allow ambient air to pass through the plurality of vents in to the housing, a sensing component configured to collect ambient air data associated with the ambient air present in the housing, a printed circuit board, the printed circuit board including a controller and a plurality of electrical components, and a protection cover arranged on at least one electrical component in the plurality of electrical components.

18 Claims, 4 Drawing Sheets

(56) References Cited

U.S. PATENT DOCUMENTS

| | | | |
|---|---|---|---|
| 7,760,102 B2 | 7/2010 | Chabanis et al. | |
| 7,812,708 B2 | 10/2010 | Müller et al. | |
| 9,349,273 B2 | 5/2016 | Fadell et al. | |
| 9,600,989 B2 | 3/2017 | Fadell et al. | |
| 10,152,866 B2* | 12/2018 | Kraz | G08B 17/113 |
| 2015/0348400 A1* | 12/2015 | Zribi | G08B 29/185 |
| | | | 340/506 |
| 2017/0061757 A1* | 3/2017 | Zribi | G08B 17/11 |
| 2019/0197855 A1* | 6/2019 | Lingala | G08B 27/006 |
| 2019/0221101 A1* | 7/2019 | Golob | G08B 21/14 |
| 2019/0221108 A1* | 7/2019 | Harris | G08B 29/043 |
| 2020/0008038 A1* | 1/2020 | Lingala | G08B 7/00 |
| 2020/0187374 A1* | 6/2020 | Seymour | H05K 5/0217 |
| 2020/0250963 A1* | 8/2020 | Rodriguez | G08B 29/043 |
| 2020/0357254 A1* | 11/2020 | Paliwal | G08B 29/18 |

FOREIGN PATENT DOCUMENTS

| | | | | |
|---|---|---|---|---|
| CN | 105678948 B | * | 5/2018 | G01N 21/49 |
| CN | 208384761 U | * | 1/2019 | |
| CN | 111933852 A | * | 11/2020 | |

OTHER PUBLICATIONS

Teknim, "Conventional Optical Smoke Detector," URL: https://www.teknim.com/tr/en-US/catalogue/detectors/conventional-optical-smoke-detector/931/261512; Retrieved: Apr. 1, 2019; 3 pages.

\* cited by examiner

INTRUSION ENTRY PROTECTION

This application claims the benefit of U.S. Patent Application No. 62/849,423 filed May 17, 2019, which is incorporated herein by reference in its entirety.

BACKGROUND

Exemplary embodiments pertain to the art of hazard detection systems and more specifically to intrusion entry protection for carbon monoxide, fire and smoke detection systems.

Conventional detection systems for detecting airborne hazards operate by detecting the presence of smoke or other airborne pollutants. Upon detection of a threshold level of particles, an alarm or other signal, such as a notification signal, may be activated and operation of a fire suppression system may be initiated. In some conventional hazard detection systems, individual detector units may be positioned at various sensing locations, and each detector unit has its own processing and sensing components. These processing and sensing components can be damaged by ingress of foreign objects such as, for example, a screw driver, a finger, and other similar objects. The smoke entry vents in a typical chambered detector device are large enough to allow the above mentioned foreign objects to pass into the detector.

BRIEF DESCRIPTION

Disclosed is a particulate detector. The particulate detector includes a housing comprising a plurality of vents configured to allow particulates to pass through the plurality of vents in to the housing, a particulate sensing component configured to collect particulate data associated with particulates present in the housing, a printed circuit board, the printed circuit board including a controller and a plurality of electrical components, and a protection cover arranged on at least one electrical component in the plurality of electrical components.

Disclosed is fire detection system. The fire detection system includes a smoke detector comprising a housing including a plurality of vents configured to allow smoke to pass through the plurality of vents in to the housing, a smoke sensing component configured to collect smoke data associated with smoke present in the housing, a printed circuit board, the printed circuit board including a controller and a plurality of electrical components, and a protection cover arranged on at least one electrical component in the plurality of electrical components.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
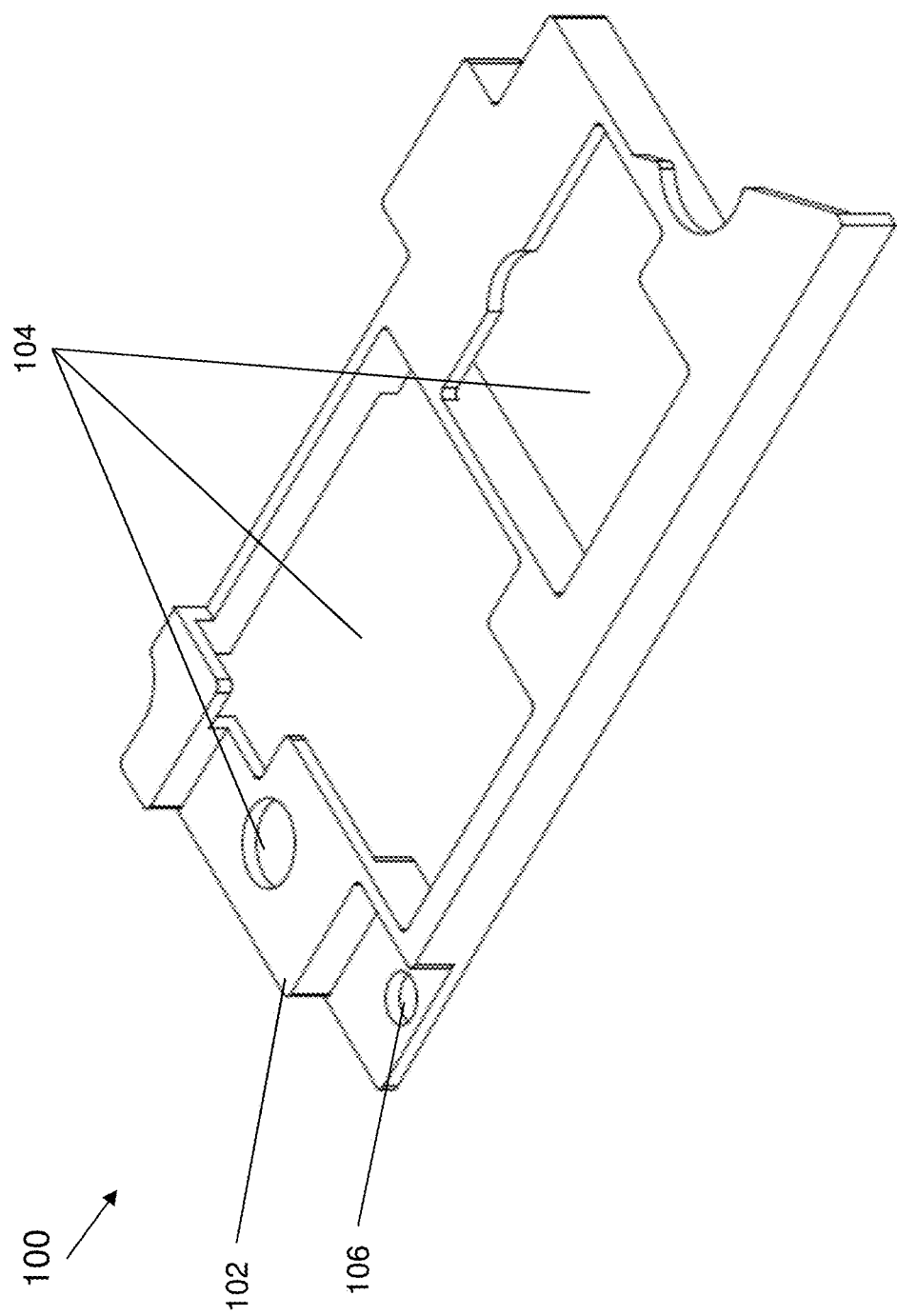
FIG. 1 depicts a diagram of a protection cover for electrical components in a detection device according to one or more embodiments.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

Turning now to an overview of technologies that are more specifically relevant to aspects of the disclosure, a particulate detection device, such as a smoke detector or carbon monoxide detector, often include electrical components for operating the devices. These electrical components can be powered by a battery or a mains power source. Chambered detection devices also typically include vents on a housing to allow for ambient air, particulates, and contaminants (e.g., smoke, carbon monoxide, etc.) to enter in to the housing to be sensed by a sensing device such as, for example, a smoke chamber or a carbon monoxide sensor. The sensing device is operated by a controller on a printed circuit board to initiate an alert or alarm based on the occurrence of an event such as the presence of smoke in a fire. The vents in the housings of these detection devices are usually large enough to allow objects such as screw drivers, fingers, metal probes, and the like to pass through and potentially come into contact with the electrical components on the printed circuit board. Any obstruction to a foreign object entering the housing may also obstruct entry of a particulate or contaminant through the vents and into the detection chamber, and diminish the capacity of the device to perform its essential detection function. More than minimal delay in detection may render a detection device unacceptable under various regulatory and agency requirements, thus it is a challenge to prevent foreign object intrusion while maintaining the detection performance of a detection device.

To protect the integrity of the printed circuit board and/or protect a user from touching portions of the printed circuit board through the aforementioned vents, embodiments described herein provide for a protection cover that is positioned such that the protection cover protects portions of the printed circuit board from contact from an object. In one or more embodiments, the protection cover can cover high voltage electrical components on the printed circuit board such as metal contacts and the like. At the same time, the protection cover is low profile and is substantially flush with the surface of the printed circuit board so as to not interfere with entry of smoke or particulates into the housing and smoke chamber.

Turning now to a more detailed description of aspects of the present disclosure, FIG. 1 depicts a diagram of a protection cover for electrical components in a detection device according to one or more embodiments. The protection cover 100 includes a body 102 with one or more orifices 104 and a fastening orifice 106. In one or more embodiments, the body 102 can be a material having a high resistivity. The material can be any material including plastic, silicon, glass, or rubber. In one or more embodiments, the resistivity of the body 102 is at or above one billion ($10^9$) ohms. The thickness of the body 102 can be between about 1 millimeters to about 3 millimeters. In one or more embodiments, the thickness of the body 102 is such that the operation of the detection device is not interfered with. For example, for a smoke detection device, the thickness of the body 102 will be such that the smoke chamber is unobstructed by the body 102 allowing for the flow of air and particulates into the smoke chamber. The protection cover 100 is shaped to cover certain portions of a printed circuit board to protect areas or portions having high voltage components. In some embodiments, the protection cover 100 includes one or more orifices 104 that are sized and shaped to allow certain non-high voltage components to protrude through the orifices 104 allowing the body 102 to be substantially flush with a printed circuit board. The fastener orifice 106 is configured to allow a fastener to couple the body 102 of the protection cover 100 to a printed circuit board surface. In one or more embodiments, the fastener can be any type of fastener including, but not limited to, a screw.

Figure 2B:
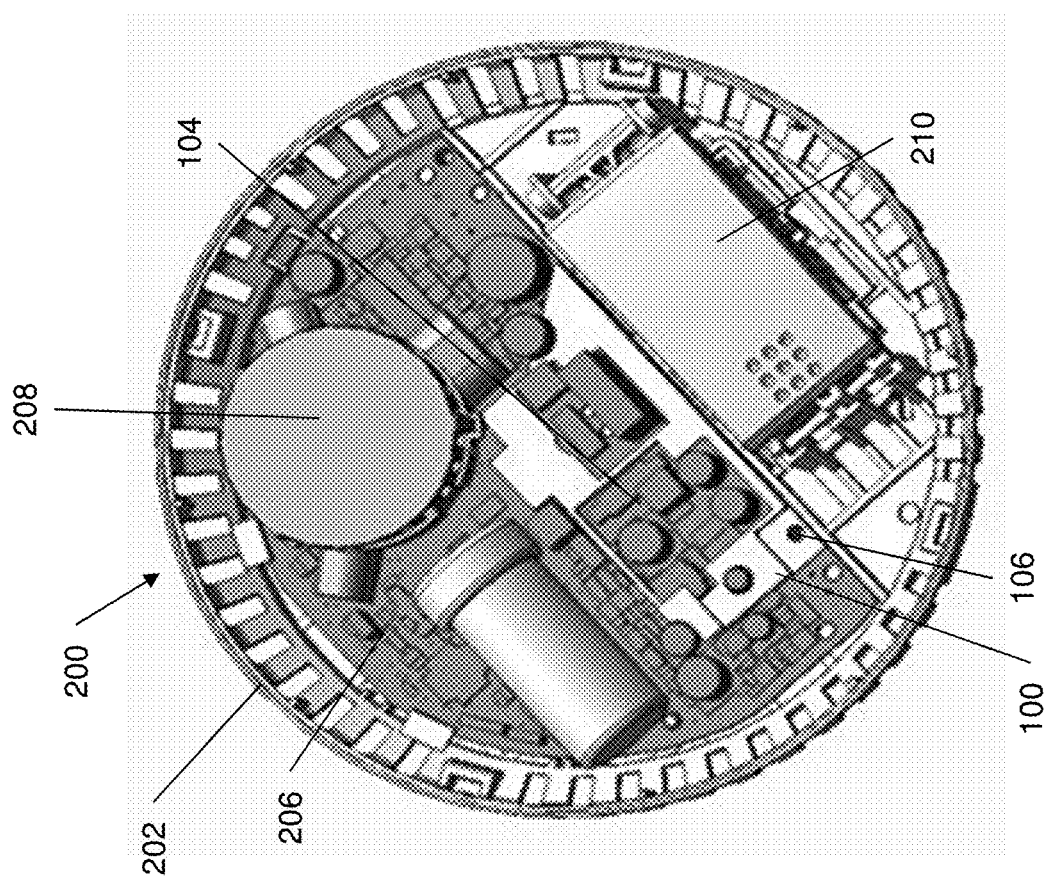
FIG. 2b depicts a diagram of the protection cover arranged over a portion of a printed circuit board in a detection device according to one or more embodiments.
Figure 2A:
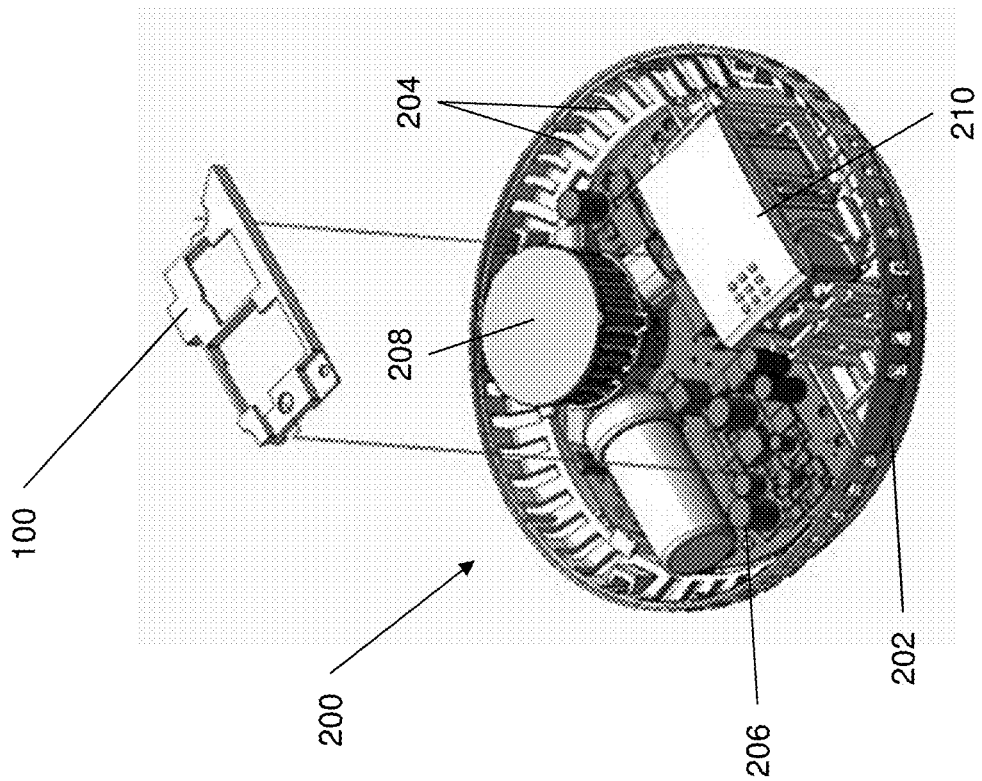
FIG. 2a depicts a diagram of a detection device and the protection cover being positioned to cover one or more regions of a printed circuit board according to one or more embodiments.

FIG. 2a depicts a diagram of a detection device and the protection cover being positioned to cover one or more regions of a printed circuit board according to one or more embodiments. In one or more embodiments, a detection device 200 including a housing 202 with a plurality of vents 204 is configured to detect particulates in the air to determine an event such as the presence of smoke or carbon monoxide. The detection device 200 includes a printed circuit board (PCB) 206, at least one sensor 208, and a power source 210. As described above and herein, the printed circuit board 206 can include a region that has high voltage electrical components. To protect this region from an intrusive object and to protect an intrusive object from this high voltage region, the protection cover 100 is positioned to cover the high voltage region. In one or more embodiments, the high voltage regions are generally in a central location on the printed circuit board 206 and away from the vents 204. However, in other embodiments, the high voltage region can be at any location on the printed circuit board 206.

FIG. 2b depicts a diagram of the protection cover arranged over a portion of a printed circuit board in a detection device according to one or more embodiments. The protection cover 100 conformally covers a portion of the printed circuit board 206 and is substantially flush with the surface of the printed circuit board 206. The one or more orifices 104 allow non-high voltage electrical components to pass through. The orifices 104 are sized and shaped so that the electrical components can pass through but do not allow an object to pass through to contact any of the high voltage electrical components on the printed circuit board 206. In one or more embodiments, the fastener orifice 106 can allow a fastener to secure the protection cover 100 to the printed circuit board 206. The fastener can be, for example, a screw that engages through the fastener orifice 106 into a thread in the printed circuit board 206. In one or more embodiments, the printed circuit board 206 includes multiple electrical components include a controller for operating of the detection device 200. The controller (located on printed circuit board 206 but not specifically referenced) can receive particulate data collected from the sensing device 208 to determine if the presence of smoke, particulates, and/or carbon monoxide are present in the housing 202. Based on this determination, the controller can enact an action such as, for example, sound an alarm or send an alert to a fire or carbon monoxide detection system. The power source 210 can be a battery or a power source for a building or vehicle which is connected to device 200 by hard-wiring or other suitable connection. In one or more embodiments, the protection cover 100 is shaped such that the height does not interfere with particulate entry into the housing 202. The protection cover 100 is substantially flush with the printed circuit board 206 and the electrical components on the printed circuit board 206 and does not rise above the level of the electrical components allowing smoke or other particulates to flow freely into the housing 202. In one or more embodiments, the sensing device 208 is operable to detect smoke particulates and/or carbon monoxide. Carbon monoxide detection includes a sensor that can detect an increase in acidity in the ambient air present in the chamber of the detector which triggers a change in voltage of the sensor 208 indicating a presence of carbon monoxide.

In one or more embodiments, the protection cover 100 is substantially flush with the printed circuit board 206 and is a low profile meaning the height does not affect the critical airflow into the chamber of the detector 200 or sensor 208. The protection cover 100 is configured such that the Laminar flow of air is not impeded as the air flows into the sensing device 208. The vents 204 (e.g., vertical slots) of the detector 200 do not impede velocities for the ambient air to flow into the detector 200 according to Laminar flow.

Figure 3:
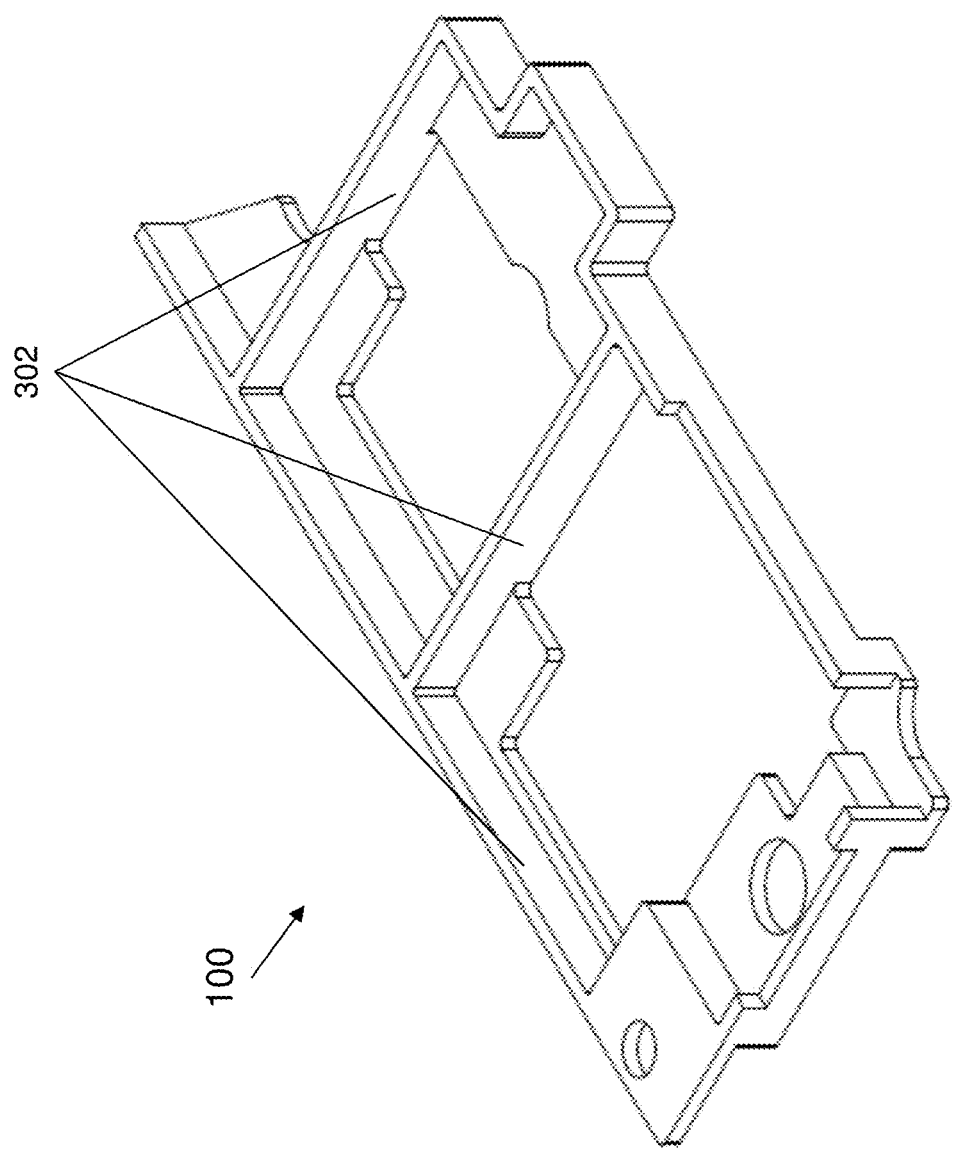
FIG. 3 depicts a diagram of a bottom view of the protection cover for electrical components in a detection device according to one or more embodiments.

FIG. 3 depicts a diagram of a bottom view of the protection cover for electrical components in a detection device according to one or more embodiments. The protection cover 100 includes a plurality of sidewalls 302 that serve to further protect the high-voltage portions of the printed circuit board (206 from FIGS. 2a and 2b). The sidewalls 302 prevent objects from contacting the electrical components of the printed circuit board from the side.

Figure 4:
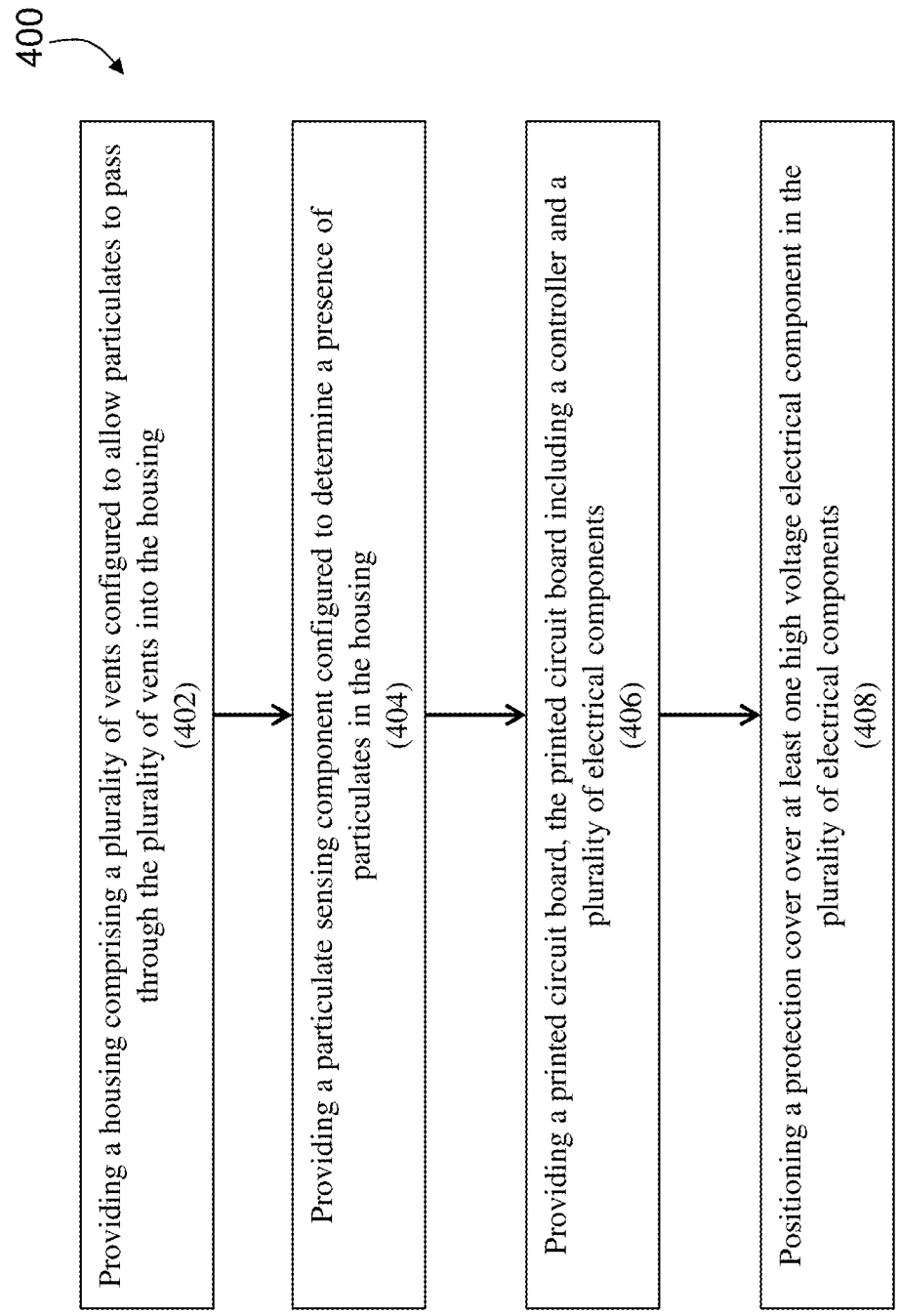
FIG. 4 depicts a flow diagram of a method for protecting electrical components in a particulate detection device according to one or more embodiments The diagrams depicted herein are illustrative. There can be many variations to the diagram or the operations described therein without departing from the spirit of the disclosure. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

FIG. 4 depicts a flow diagram of a method for protecting electrical components in a particulate detection device according to one or more embodiments. The method 400 includes providing a housing comprising a plurality of vents configured to allow particulates to pass through the plurality of vents into the housing, as shown in block 402. At block 404, the method 400 includes providing a particulate sensing component configured to determine a presence of particulates in the housing. The method 400, at block 406, includes providing a printed circuit board, the printed circuit board including a controller and a plurality of electrical components. And at block 408, the method 400 includes positioning a protection cover over at least one high voltage electrical component in the plurality of electrical components.

Additional processes may also be included. It should be understood that the processes depicted in FIG. 4 represent illustrations and that other processes may be added or existing processes may be removed, modified, or rearranged without departing from the scope and spirit of the present disclosure.

A detailed description of one or more embodiments of the disclosed apparatus are presented herein by way of exemplification and not limitation with reference to the Figures.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A detector comprising:
   a housing comprising a plurality of vents configured to allow ambient air to pass through the plurality of vents in to the housing;
   a sensing component configured to collect ambient air data associated with the ambient air present in the housing;
   a printed circuit board, the printed circuit board including a controller and a plurality of electrical components; and
   a protection cover, separate from the housing, arranged on at least one electrical component in the plurality of electrical components, wherein the at least one electrical component comprises a high voltage electrical component;
   wherein the protection cover is substantially flush with a surface of the printed circuit board;
   wherein the protection cover comprises at least one orifice configured to allow at least one non-high voltage electrical component in the plurality of electrical components to pass through the at least one orifice.

2. The detector of claim 1, wherein the protection cover comprises a material having a resistivity.

3. The detector of claim 2, wherein the resistivity comprises about one billion ohms.

4. The detector of claim 2, wherein the material comprises a plastic.

5. The detector of claim 1, wherein the protection cover is coupled to the printed circuit board by at least one fastener.

6. The detector of claim 5, wherein the at least on fastener comprises a screw.

7. The detector of claim 1, wherein the protection cover is coupled to the printed circuit board by an adhesive.

8. The detector of claim 1, wherein the protection cover comprises a thickness of about 2 millimeters.

9. The detector of claim 1, wherein the controller is configured to:
   receive, from the sensing component, contaminant data; and
   determine an event based on the contaminant data.

10. The detector of claim 9, wherein the controller is further configured to initiate an alarm based at least in part on the event.

11. The detector of claim 8, wherein the event comprises a detection of smoke.

12. The detector of claim 8, wherein the event comprises a detection of carbon monoxide.

13. The detector of claim 1, wherein the protection cover is contained entirely within the enclosure.

14. The detector of claim 1, wherein the protection cover is mounted over only a portion of the printed circuit board.

15. A fire detection system comprising:
   a smoke detector comprising a housing including a plurality of vents configured to allow smoke to pass through the plurality of vents in to the housing;
   a smoke sensing component configured to collect smoke data associated with smoke present in the housing;
   a printed circuit board, the printed circuit board including a controller and a plurality of electrical components; and
   a protection cover, separate from the housing, arranged on at least one electrical component in the plurality of electrical components;
   wherein the at least one electrical component comprises a high voltage electrical component;
   wherein the protection cover is substantially flush with a surface of the printed circuit board;
   wherein the protection cover comprises at least one orifice configured to allow at least one non-high voltage electrical component in the plurality of electrical components to pass through the at least one orifice.

16. The fire detection system of claim 15, wherein the protection cover comprises a material having a resistivity, the resistivity comprising at least one billion ohms.

17. The fire detection system of claim 15, wherein the protection cover is coupled to the printed circuit board by at least one fastener.

18. The fire detection system of claim 15, wherein the protection cover is coupled to the printed circuit board by an adhesive.

* * * * *